(12) United States Patent
Tsuchiya et al.

(10) Patent No.: US 12,322,631 B2
(45) Date of Patent: Jun. 3, 2025

(54) SUBSTRATE PROCESSING SYSTEM, SUBSTRATE PROCESSING METHOD, AND RECORDING MEDIUM

(71) Applicant: Tokyo Electron Limited, Tokyo (JP)

(72) Inventors: Takafumi Tsuchiya, Koshi (JP); Hiromi Hara, Koshi (JP); Wataru Tsukinoki, Koshi (JP); Shuhei Goto, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 301 days.

(21) Appl. No.: 18/170,087

(22) Filed: Feb. 16, 2023

(65) Prior Publication Data

US 2023/0268213 A1    Aug. 24, 2023

(30) Foreign Application Priority Data

Feb. 21, 2022    (JP) .................. 2022-024981

(51) Int. Cl.
*H01L 21/677*    (2006.01)
*H01L 21/687*    (2006.01)

(52) U.S. Cl.
CPC .. *H01L 21/67781* (2013.01); *H01L 21/67766* (2013.01); *H01L 21/67769* (2013.01); *H01L 21/68707* (2013.01)

(58) Field of Classification Search
CPC ......... H01L 21/67276; H01L 21/67781; H01L 21/677; H01L 21/67769; H01L 21/67766; H01L 21/68707; H01L 21/67748; H01L 21/67751; H01L 21/67754; H01L 21/67757; H01L 21/67778; H01L 21/67161; H01L 21/67173; H01L 21/67167; H01L 21/67178; H01L 21/67196

See application file for complete search history.

(56) References Cited

U.S. PATENT DOCUMENTS 5,518,542 A * 5/1996 Matsukawa ............... B08B 1/52
                                                                118/712
5,565,034 A * 10/1996 Nanbu ............... H01L 21/67265
                                                                118/712

FOREIGN PATENT DOCUMENTS

JP    2021-064654 A    4/2021

* cited by examiner

*Primary Examiner* — Glenn F Myers
(74) *Attorney, Agent, or Firm* — Chrisman Gallo Tochtrop LLC

(57) ABSTRACT

A substrate processing system includes a carry-in/out unit in which a cassette accommodating therein multiple substrates is carried in and out; a batch processing unit configured to process a lot including the multiple substrates at once; a single-wafer processing unit configured to process the substrates one by one; a first interface unit configured to distribute the substrates to the single-wafer processing unit or the batch processing unit; and a second interface unit configured to transfer the substrates between the batch processing unit and the single-wafer processing unit. The first interface unit includes a first placement unit configured to place therein the substrates before and after being processed by the single-wafer processing unit; a second placement unit configured to place therein the substrates before being processed by the batch processing unit; and a transfer device configured to transfer the substrates to the first placement unit and the second placement unit.

10 Claims, 4 Drawing Sheets

SUBSTRATE PROCESSING SYSTEM, SUBSTRATE PROCESSING METHOD, AND RECORDING MEDIUM

CROSS-REFERENCE TO RELATED APPLICATION

This application claims the benefit of Japanese Patent Application No. 2022-024981 filed on Feb. 21, 2022, the entire disclosure of which is incorporated herein by reference.

TECHNICAL FIELD

The various aspects and embodiments described herein pertain generally to a substrate processing system, a substrate processing method, and a recording medium.

BACKGROUND

A substrate processing system described in Patent Document 1 includes a batch processing unit and a single-wafer processing unit. The batch processing unit maintains semiconductor wafers washed with water in the water. The semiconductor wafers are chemically processed in the state that a plurality of the wafers is mounted on a single holder. A transfer unit picks up the semiconductor wafers one by one from a buffer tank, and transfers each of them to the single-wafer processing unit. The single-wafer processing unit dries the single semiconductor wafer transferred by the transfer unit, while supporting the semiconductor wafer so that a main surface thereof is kept horizontal.

Patent Document 1: Japanese Patent Laid-open Publication No. 2021-064654

SUMMARY

In one exemplary embodiment, a substrate processing system includes a carry-in/out unit in which a cassette accommodating therein multiple substrates is carried in and out; a batch processing unit configured to process a lot including the multiple substrates at once; a single-wafer processing unit configured to process the substrates one by one; a first interface unit configured to distribute the substrates accommodated in the cassette to either the single-wafer processing unit or the batch processing unit; and a second interface unit configured to transfer the substrates between the batch processing unit and the single-wafer processing unit. The first interface unit includes a first placement unit configured to place therein the substrates before and after being processed by the single-wafer processing unit; a second placement unit configured to place therein the substrates before being processed by the batch processing unit; and a transfer device configured to transfer the substrates accommodated in the cassette to the first placement unit and the second placement unit.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
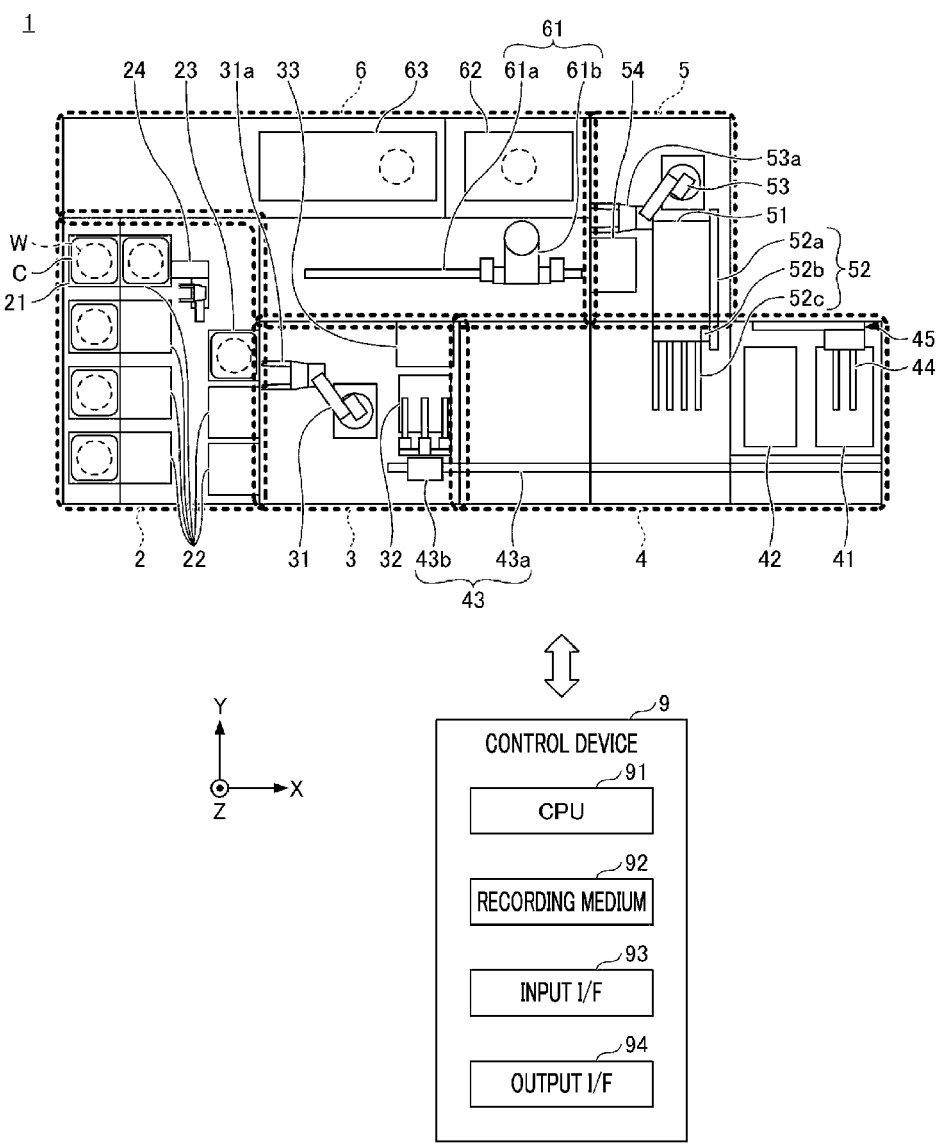
FIG. 1 is a plan view illustrating a substrate processing system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, non-limiting exemplary embodiments of the present disclosure will be described with reference to the accompanying drawings. In all of the accompanying drawings, same or corresponding parts or components will be assigned same reference numerals, and redundant description thereof will be omitted.

(Substrate Processing System)

Referring to FIG. 1, a substrate processing system according to an exemplary embodiment will be explained. As depicted in FIG. 1, a substrate processing system 1 includes a carry-in/out unit 2, a first interface unit 3, a batch processing unit 4, a second interface unit 5, a single-wafer processing unit 6, and a control device 9.

The carry-in/out unit 2 serves as both a carry-in unit and a carry-out unit. For this reason, the substrate processing system 1 can be reduced in size. The carry-in/out unit 2 includes a load port 21, a stocker 22, a loader 23, and a cassette transfer device 24.

The load port 21 is disposed on the negative X-axis side of the carry-in/out unit 2. The load port 21 is plural in number, and the plurality of (for example, four) load ports 21 are arranged along the Y-axis direction. However, the number of the load ports 21 is not particularly limited. A cassette C is placed in each load port 21. The cassette C accommodates therein a plurality of (for example, 25) substrates W, and is carried into/from the load port 21. Inside the cassette C, the substrates W are held horizontally at a second pitch P2 therebetween in a vertical direction. The second pitch is N times a first pitch P1 (P2=N×P1). N is a natural number equal to or larger than 2. In the present exemplary embodiment, N is 2. However, it may be 3 or more.

The stocker 22 is plural in number, and the plurality of (for example, four) stockers 22 are arranged along the Y-axis direction at the center of the carry-in/out unit 2 in the X-axis direction. A plurality of (for example, two) stockers 22 are disposed along the Y-axis direction to be adjacent to a first interface unit 3 on the positive X-axis side of the carry-in/out unit 2. The stockers 22 may be arranged in multiple levels in a vertical direction. The stocker 22 temporarily stores therein a cassette C in which substrates W before being subjected to a cleaning processing are stored, an empty cassette C from which substrates W have been taken out, and so forth. Here, the number of the stockers 22 is not particularly limited.

The loader 23 is provided adjacent to the first interface unit 3, and is disposed on the positive X-axis side of the carry-in/out unit 2. The cassette C is placed in the loader 23. The loader 23 is provided with a lid opening/closing mechanism (not shown) for opening or closing a lid of the cassette C. The loader 23 may be plural in number, and the plurality of loaders 23 may be arranged in multiple levels in the vertical direction.

The cassette transfer device 24 is, for example, a multi-joint transfer robot. The cassette transfer device 24 transfers the cassette C between the load port 21, the stocker 22, and the loader 23.

The first interface unit 3 is disposed on the positive X-axis side of the carry-in/out unit 2. The first interface unit 3 transfers the substrate W between the carry-in/out unit 2, the batch processing unit 4, and the single-wafer processing unit 6. The first interface unit 3 has a substrate moving/placing device 31, a lot forming unit 32, and a first delivery table 33.

The substrate moving/placing device 31 transfers the substrate W between the cassette C disposed in the loader 23, the lot forming unit 32, and the first delivery table 33. The substrate moving/placing device 31 distributes the substrates W accommodated in the cassette C placed in the loader 23 to the first delivery table 33 for transferring the substrates to the single-wafer processing unit 6 and the lot forming unit 32 for transferring the substrates to the batch processing unit 4. The substrate moving/placing device 31 is composed of a multi-axis (for example, 6-axis) arm robot, and has a substrate holding arm 31a at a leading end thereof. The substrate holding arm 31a has a plurality of holding claws (not shown) capable of holding a plurality of (for example, 25 sheets) substrates W. The substrate holding arm 31a can take any position and posture in a three-dimensional space while holding the substrates W with the holding claws.

The lot forming unit 32 is disposed on the positive X-axis side of the first interface unit 3. The lot forming unit 32 holds a plurality of substrates W at the first pitch P1 to form a lot L.

The first delivery table 33 is disposed adjacent to the single-wafer processing unit 6 on the positive Y-axis side of the first interface unit 3. The first delivery table 33 includes a first region in which the substrate W before being processed in the single-wafer processing unit 6 is placed and a second region in which the substrate W after being processed in the single-wafer processing unit 6 is placed. The first region and the second region are arranged in the vertical direction. Desirably, the second region is provided at an upper end in the vertical direction than the first region. In this case, it is possible to suppress the substrate after being processed from being contaminated with a foreign substance falling from the substrate before being processed. In the first region, a plurality of substrates W is disposed at the second pitch P2 therebetween. The first region is configured to place therein a first number of sheets of substrates W. The first number of sheets is, for example, 25 sheets. The first number is, for example, the same number as the number of substrates W accommodated in the cassette C. In the second region, a multiplicity of substrates W are disposed at the second pitch P2 therebetween. The second region is configured to place therein a second number of sheets of substrates W. The second number of sheets is larger than the first number of sheets, and is, for example, 50 sheets or 100 sheets. The second number is, for example, the same number as the number of substrates W constituting the lot L. The lot L is composed of the substrates W carried from the multiple cassettes C. In the first region, the first delivery table 33 receives the substrate W from the substrate moving/placing device 31 and temporarily stores the received substrate W therein until the substrate W is transferred to the single-wafer processing unit 6. In the second region, the first delivery table 33 receives the substrate W from a fourth transfer device 61 and temporarily stores the received substrate W therein until the substrate W is handed over to the carry-in/out unit 2.

The batch processing unit 4 is disposed on the positive X-axis side of the first interface unit 3. That is, the carry-in/out unit 2, the first interface unit 3, and the batch processing unit 4 are disposed in this order from the negative X-axis side toward the positive X-axis side. The batch processing unit processes the lot L incorporating therein a multiple number of sheets (for example, 50 sheets or 100 sheets) of substrates W at the first pitch P1. The single lot L is composed of substrates W from, for example, M number of cassettes. M is a natural number equal to or larger than 2. M may be the same natural number as N, or may be a natural number different from N. The batch processing unit 4 includes a chemical liquid tank 41, a rinse liquid tank 42, a first transfer device 43, a processing tool 44, and a driving device 45.

The chemical liquid tank 41 and the rinse liquid tank 42 are disposed along the X-axis direction. By way of example, the chemical liquid tank 41 and the rinse liquid tank 42 are arranged in this order from the positive X-axis side toward the negative X-axis side. Further, the chemical liquid tank 41 and the rinse liquid tank 42 are referred to as a processing tank together. The number of the chemical liquid tank 41 and the rinse liquid tank 42 is not limited to the example shown in FIG. 1. For example, although a single set of the chemical liquid tank 41 and the rinse liquid tank 42 is provided in FIG. 1, multiple sets may be provided.

The chemical liquid tank 41 stores therein a chemical liquid in which the lot L is to be immersed. The chemical liquid is, for example, a phosphoric acid aqueous solution ($H_3PO_4$). The phosphoric acid aqueous solution selectively etches and removes a silicon nitride film among a silicon oxide film and the silicon nitride film. The chemical liquid is not limited to the phosphoric acid aqueous solution. By way of example, the chemical liquid may be DHF (dilute hydrofluoric acid), BHF (a mixed solution of hydrofluoric acid and ammonium fluoride), dilute sulfuric acid, SPM (a mixed solution of sulfuric acid, hydrogen peroxide and water), SC1 (a mixed solution of ammonia, hydrogen peroxide and water), SC2 (a mixed solution of hydrochloric acid, hydrogen peroxide and water), TMAH (a mixed solution of tetramethylammonium hydroxide and water), a plating solution, or the like. The chemical liquid may be used for a peeling processing or a plating processing. The number of the chemical liquid is not particularly limited, and a plurality of chemical liquids may be used.

The rinse liquid tank 42 stores therein a first rinse liquid in which the lot L is to be immersed. The first rinse liquid is, for example, DIW (deionized water) as pure water that removes the chemical liquid from the substrate W.

The first transfer device 43 has a guide rail 43*a* and a first transfer arm 43*b*. The guide rail 43*a* is disposed on the negative Y-axis side of the processing tank. The guide rail 43*a* extends from the first interface unit 3 to the batch processing unit 4 along a horizontal direction (X-axis direction). The first transfer arm 43*b* is moved in the horizontal direction (X-axis direction) along the guide rail 43*a*. The first transfer arm 43*b* may be moved in a vertical direction or may be rotated around a vertical axis. The first transfer ram 43*b* transfers the lot L collectively between the first interface unit 3 and the batch processing unit 4.

The processing tool 44 receives the lot L from the first transfer arm 43*b* and holds it. The processing tool 44 holds the multiple number of substrates W at the first pitch P1 in the Y-axis direction, while holding each of the multiple number of substrates W vertically.

The driving device 45 moves the processing tool 44 in the X-axis direction and the Z-axis direction. The processing tool 44 immerses the lot L in the chemical liquid stored in the chemical liquid tank 41, then immerses the lot L in the first rinse liquid stored in the rinse liquid tank 42, and, thereafter, hands the lot L over to the first transfer device 43.

The unit number of the processing tool 44 and the driving device 45 is one in the present exemplary embodiment. However, they may be plural. In the latter case, one unit may immerse the lot L in the chemical liquid stored in the chemical liquid tank 41, and the other unit may immerse the lot L in the first rinse liquid stored in the rinse liquid tank 42. In this case, the driving device 45 only needs to move the processing tool 44 in the Z-axis direction, and may not need to move the processing tool 44 in the X-axis direction.

The second interface unit 5 is disposed on the positive Y-axis side of the batch processing unit 4. The second interface unit 5 transfers the substrate W between the batch processing unit 4 and the single-wafer processing unit 6. The second interface unit 5 has an immersion tank 51, a second transfer device 52, a third transfer device 53, and a second delivery table 54.

The immersion tank 51 is disposed outside a movement range of the first transfer arm 43*b*. For example, the immersion tank 51 is disposed at a position shifted from the processing tank in the positive Y-axis direction. The immersion tank 51 stores therein a second rinse liquid in which the lot L is to be immersed. The second rinse liquid is, for example, DIW (deionized water). The substrate W is maintained in the second rinse liquid until it is picked up from the second rinse liquid by the third transfer device 53. Since the substrate W exists below a liquid surface of the second rinse liquid, a surface tension of the second rinse liquid does not act on the substrate W, so that a collapse of an irregularity pattern of the substrate W can be suppressed.

The second transfer device 52 includes a Y-axis driving device 52*a*, a Z-axis driving device 52*b*, and a second transfer arm 52*c*.

The Y-axis driving device 52*a* is disposed on the positive X-axis side of the second interface unit 5. The Y-axis driving device 52*a* extends from the second interface unit 5 to the batch processing unit 4 along a horizontal direction (Y-axis direction). The Y-axis driving device 52*a* moves the Z-axis driving device 52*b* and the second transfer arm 52*c* in the Y-axis direction. The Y-axis driving device 52*a* may include a ball screw.

The Z-axis driving device 52*b* is movably mounted to the Y-axis driving device 52*a*. The Z-axis driving device 52*b* moves the second transfer arm 52*c* in the Z-axis direction. The Z-axis driving device 52*b* may include a ball screw.

The second transfer arm 52*c* is movably mounted to the Z-axis driving device 52*b*. The second transfer arm 52*c* receives the lot L from the first transfer arm 43*b* and holds it. The second transfer arm 52*c* holds the multiple number of substrates W at the first pitch P1 in the Y-axis direction, while holding each of the substrates W vertically. The second transfer arm 52*c* is moved in the Y-axis direction and the Z-axis direction by the Y-axis driving device 52*a* and the Z-axis driving device 52*b*. The second transfer arm 52*c* is configured to be movable between multiple positions including a delivery position, an immersion position, and a standby position.

The delivery position is a position where the lot L is delivered between the first transfer arm 43*b* and the second transfer arm 52*c*. The delivery position is a position on the negative Y-axis and positive Z-axis side.

The immersion position is a position where the lot L is immersed in the immersion tank 51. The immersion position is a position on the positive Y-axis and negative Z-axis side of the delivery position.

The standby position is a position where the second transfer arm 52*c* stands by when the lot L is neither transferred nor immersed in the immersion tank 51. The standby position is a position located directly below the delivery position (negative Z-axis side) without hindering a movement of the first transfer arm 43*b*. In this case, since the second transfer arm 52*c* can be moved to the delivery position only by moving upwards (in the positive Z-axis direction), a throughput is improved. The standby position may be the same position as the immersion position. In this case, particles that may be generated as a result of the operation of the first transfer device 43 can be suppressed from adhering to the second transfer arm 52*c*. Alternatively, the standby position may be a position directly above the immersion position (positive Z-axis side). In this way, by setting the standby position to be different from the transfer position, a contact between the first transfer arm 43*b* and the second transfer arm 52*c* can be suppressed.

This second transfer device 52 moves the second transfer arm 52*c* to the immersion position or the standby position while the first transfer device 43 is operating. Therefore, a contact between the first transfer arm 43*b* and the second transfer arm 52*c* can be suppressed.

The third transfer device 53 is composed of a multi-axis (for example, 6-axis) arm robot, and has a third transfer arm 53*a* at a leading end thereof. The third transfer arm 53*a* has a holding claw (not shown) capable of holding a single sheet of substrate W. The third transfer arm 53*a* can take any position and posture in a three-dimensional space while holding the substrate W with the holding claw. The third transfer device 53 transfers the substrate W between the second transfer arm 52*c* at the immersion position and the second delivery table 54. At this time, since the immersion tank 51 is disposed outside the movement range of the first transfer arm 43*b*, the first transfer arm 43*b* and the third transfer arm 53*a* do not interfere with each other. Thus, one of the first transfer device 43 and the third transfer device 53 can be independently operated irrespective of an operational status of the other. For this reason, since the first transfer device 43 and the third transfer device 53 can be operated at required timings, the time required for the transfer of the substrate W can be shortened. As a result, productivity of the substrate processing system 1 is improved.

The second delivery table 54 is disposed adjacent to the single-wafer processing unit 6 on the negative X-axis side of the second interface unit 5. The second delivery table 54 receives the substrate W from the third transfer device 53 and temporarily stores it until it is transferred to the single-wafer processing unit 6. That is, the substrate W taken out from the immersion tank 51 is placed on the second delivery table 54. It is desirable that a surface of the substrate W disposed on the second delivery table 54 is wet with, for example, the second rinse liquid. In this case, since the surface tension of the second rinse liquid does not act on the substrate W, a collapse of the irregularity pattern of the substrate W can be suppressed. A plurality of (for example, two) substrates W are placed on the second delivery table 54.

The single-wafer processing unit 6 is disposed on the negative X-axis side of the second interface unit 5 and on the positive Y-axis side of the carry-in/out unit 2, the first interface unit 3, and the batch processing unit 4. The single-wafer processing unit 6 processes the substrates W one by one. The single-wafer processing unit 6 has a fourth transfer device 61, a liquid processing apparatus 62, and a drying apparatus 63.

The fourth transfer device 61 has a guide rail 61a and the fourth transfer arm 61b. The guide rail 61a is disposed on the negative Y-axis side of the single-wafer processing unit 6. The guide rail 61a extends along a horizontal direction (X-axis direction) in the single-wafer processing unit 6. The fourth transfer arm 61b is moved in the horizontal direction (X-axis direction) along the guide rail 61a and in the vertical direction, and is rotated around a vertical axis. The fourth transfer arm 61b transfers the substrate W between the second delivery table 54, the liquid processing apparatus 62, the drying apparatus 63, and the first delivery table 33. The number of the fourth transfer arm 61b may be one or more. In the latter case, the fourth transfer device 61 transfers a plurality of (for example, five) substrates W at once.

The liquid processing apparatus 62 is disposed on the positive X-axis and positive Y-axis side of the single-wafer processing unit 6. The liquid processing apparatus 62 is of a single-wafer type, and it processes the substrates W one by one with a processing liquid. The liquid processing apparatus 62 is plural in number, and these liquid processing apparatuses 62 are arranged in multiple levels (e.g., three levels) in a vertical direction (Z-axis direction). Accordingly, multiple substrates W can be simultaneously processed with the processing liquid. The processing liquid may be plural in number. For example, pure water such as DIW and a drying liquid having a lower surface tension than the pure water may be used. The drying liquid may be, by way of example, alcohol such as IPA (isopropyl alcohol).

The drying apparatus 63 is disposed adjacent to the negative X-axis side of the liquid processing apparatus 62. In this case, an end face of the single-wafer processing unit 6 on the positive Y-axis side may be disposed so as to be aligned with or substantially aligned with an end face of the second interface unit 5 on the positive Y-axis side. Therefore, since a dead space is hardly formed, a footprint of the substrate processing system 1 can be made small. In contrast, if the drying apparatus 63 is disposed adjacent to the positive Y-axis side of the liquid processing apparatus 62, the end face of the single-wafer processing unit 6 on the positive Y-axis side may be protruded more than the end face of the second interface unit 5 on the positive Y-axis side, resulting in formation of a dead space. The drying apparatus 63 is of a single-wafer type, and it dries the substrates W one by one with a supercritical fluid. The drying apparatus 63 is plural in number, and these drying apparatuses 63 are arranged in multiple levels (e.g., three levels) in the vertical direction. Accordingly, multiple substrates W can be simultaneously dried.

Both the liquid processing apparatus 62 and the drying apparatus 63 may not be of a single-wafer type, and the liquid processing apparatus 62 may be of a single-wafer type and the drying apparatus 63 may be of a batch type. The drying apparatus 63 may dry multiple substrates W at once by using a supercritical fluid. The number of the substrates W processed at once in the drying apparatus 63 may be equal to or larger than the number of the substrates W processed at once in the liquid processing apparatus 62, or may be less than that. Apparatuses other than the liquid processing apparatus 62 and the drying apparatus 63 may be disposed in the single-wafer processing unit 6.

The control device 9 is, for example, a computer, and includes a CPU (Central Processing Unit) 91 and a recording medium 92 such as a memory. The recording medium 92 stores therein a program for controlling various processings performed in the substrate processing system 1. The control device 9 controls an operation of the substrate processing system 1 by causing the CPU 91 to execute the program stored in the recording medium 92. The control device 9 is equipped with an input interface 93 and an output interface 94. The control device 9 receives a signal from the outside through the input interface 93 and transmits a signal to the outside through the output interface 94.

The program is stored, for example, in a computer-readable recording medium, and is installed from the recording medium to the recording medium 92 of the control device 9. The computer-readable recording medium may be, by way of non-limiting example, a hard disk (HD), a flexible disk (FD), a compact disk (CD), a magnet optical disk (MO), a memory card, or the like. Further, the program may be downloaded from a server through the Internet and installed in the recording medium 92 of the control device 9.

The control device 9 is configured to control the substrate moving/placing device 31 to transfer the plurality of substrates W accommodated in the cassette C to either one of the first delivery table 33 and the lot forming unit 32 based on information associated with the cassette C carried into the carry-in/out unit 2. The information may include a substrate type. For example, when the substrate type is a product substrate, the control device 9 controls the substrate moving/placing device 31 to transfer the substrates W accommodated in the cassettes C to the lot forming unit 32. For another example, when the substrate type is a dummy substrate, the control device 9 controls the substrate moving/placing device 31 to transfer the substrate W accommodated in the cassette C to the first delivery table 33.

The substrate processing system according to the exemplary embodiment described above includes the carry-in/out unit 2, the first interface unit 3, the batch processing unit 4, the second interface unit 5, and the single-wafer processing unit 6. The first interface unit 3 is configured to distribute the substrates W accommodated in the cassette C in the carry-in/out unit 2 to either one of the single-wafer processing unit 6 and the batch processing unit 4. The substrates W distributed to the single-wafer processing unit 6 are subjected to a single-wafer processing in the single-wafer processing unit 6. The substrates W distributed to the batch processing unit 4 are subjected to a batch processing in the batch processing unit 4. The second interface unit 5 transfers the batch-processed substrates W to the single-wafer processing unit 6. The substrates W transferred to the single-wafer processing unit 6 are subjected to the single-wafer processing in the single-wafer processing unit 6. In this way, a complex processing including the batch processing and the single-wafer processing, and the single-wafer processing without passing through the batch processing unit 4 can be performed in parallel for the substrates W accommodated in the cassettes C in the carry-in/out unit 2.

(Operation of Substrate Processing System)

The operation of the substrate processing system 1 according to the exemplary embodiment, that is, a substrate processing method will be described with reference to FIG. 2 to FIG. 4. A processing shown in FIG. 2 is carried out under the control of the control device 9.

First, the cassette C accommodating therein the plurality of substrates W is carried into the carry-in/out unit 2, and is placed in the load port 21. Inside the cassette C, the substrates W are held horizontally at the second pitch P2 therebetween in the vertical direction (P2=N×P1). N is a natural number equal to or larger than 2. Although N is 2 in the present exemplary embodiment, it may be 3 or more.

Figure 3:
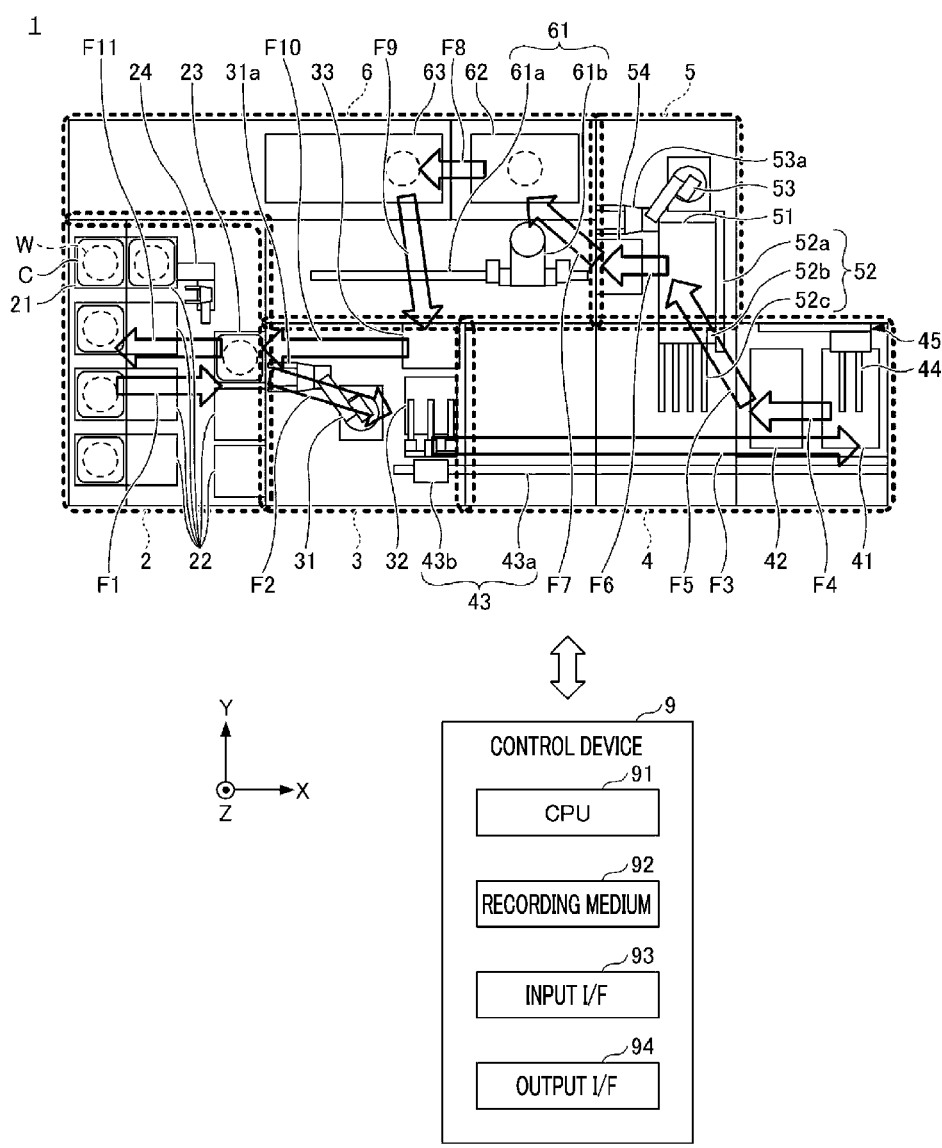
FIG. 3 is a diagram illustrating an operation of a complex processing of the substrate processing method according to the exemplary embodiment.
Figure 4:
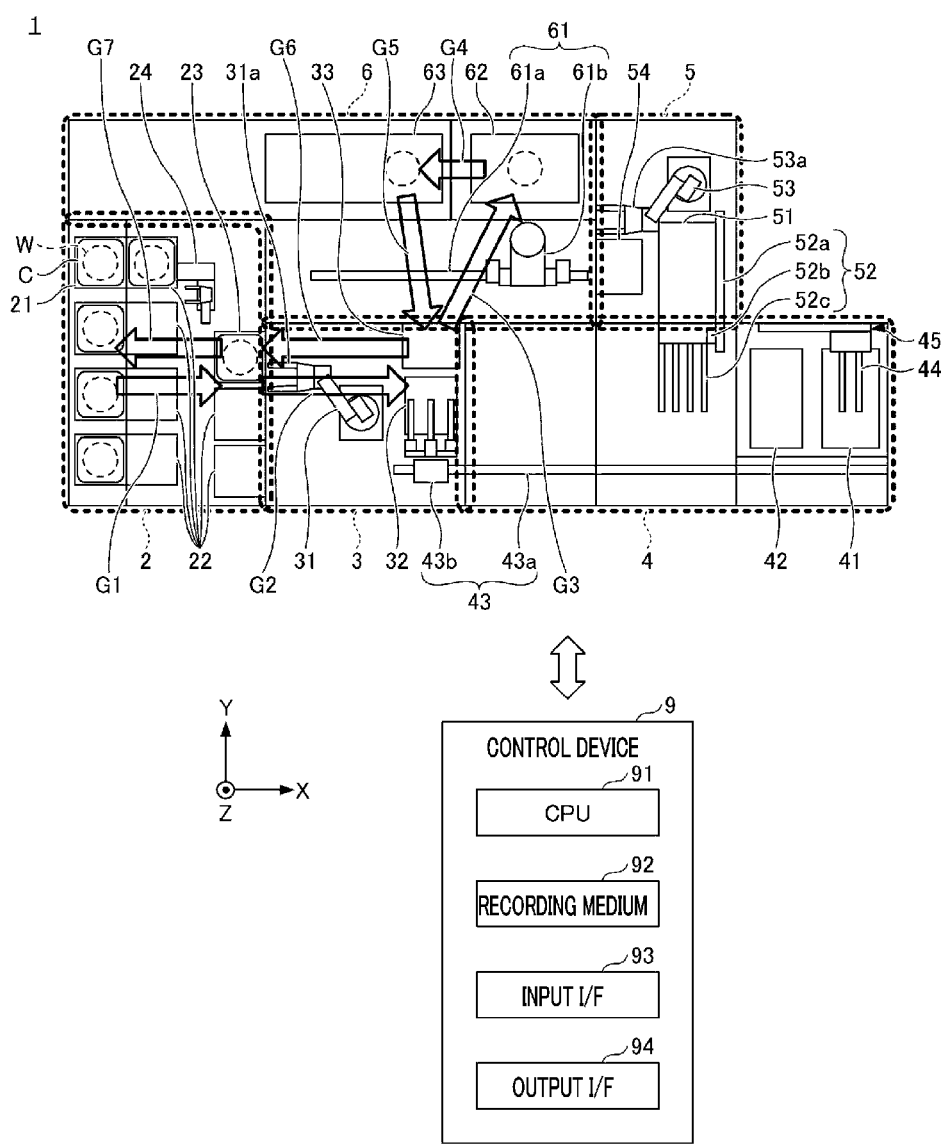
FIG. 4 is a diagram illustrating an operation of a single-wafer processing of the substrate processing method according to the exemplary embodiment.

Next, the cassette transfer device 24 transfers the cassette C from the load port 21 to the loader 23 (as indicated by an arrow F1 in FIG. 3 and an arrow G1 in FIG. 4). If the cassette C is transferred to the loader 23, the lid of the cassette C is opened by the lid opening/closing mechanism.

Figure 2:
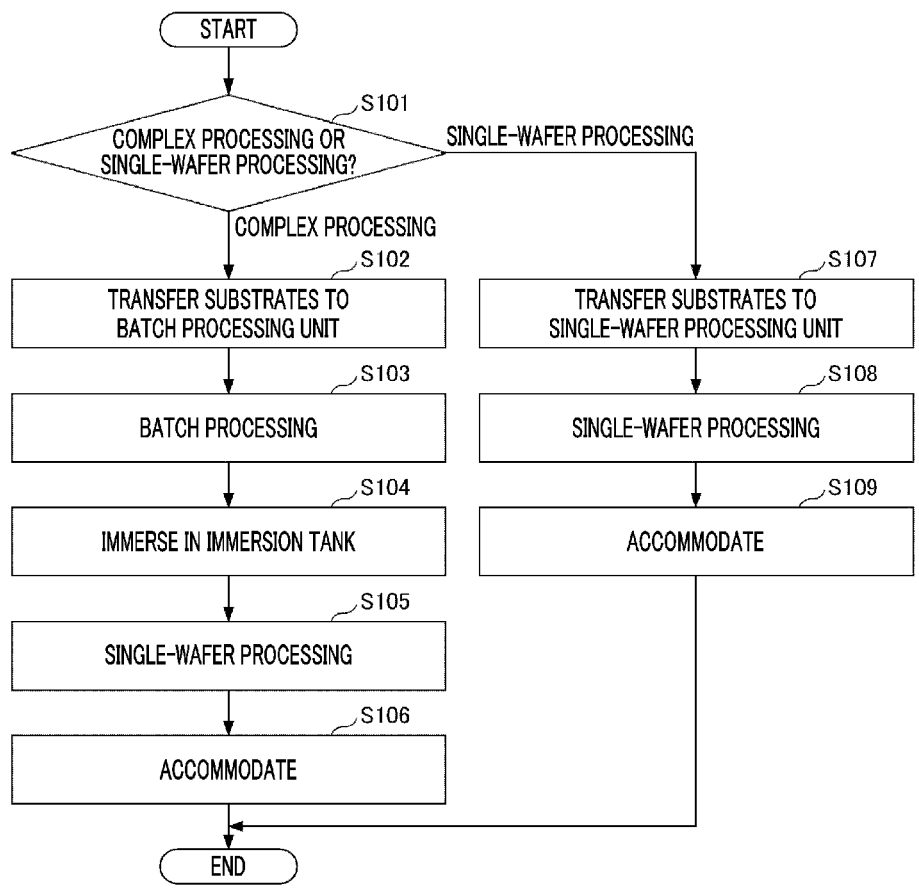
FIG. 2 is a flowchart illustrating a substrate processing method according to the exemplary embodiment.

Then, the control device 9 controls the individual components of the substrate processing system 1 so as to perform the processing shown in FIG. 2. The control device 9 controls the individual components of the substrate processing system 1 to perform the processing shown in FIG. 2 whenever the cassette C is placed in the loader 23.

First, if the cassette C is transferred to the loader 23, the control device 9, based on the information associated with the cassette C, determines whether to perform the complex processing or the single-wafer processing on the plurality of substrates W accommodated in the cassette C (S101 in FIG. 2).

When it is determined in the process S101 of FIG. 2 that the complex processing is to be performed, the control device 9 controls the individual components of the substrate processing system 1 so that the substrates W accommodated in the cassettes C are transferred to the batch processing unit 4 (S102 in FIG. 2). Specifically, the substrate moving/placing device 31 receives the substrates W accommodated in the cassettes C, and transfers them to the lot forming unit 32 (as indicated by an arrow F2 in FIG. 3). Thereafter, the lot forming unit 32 forms the lot L by holding the multiple number of substrates W at the first pitch P1 (P1=P2/N). The single lot L is composed of the substrates W from, for example, the M number of cassettes C. Since the pitch of the substrates W is narrowed from the second pitch P2 to the first pitch P1, the number of substrates W processed at once can be increased. Then, the first transfer device 43 receives the lot L from the lot forming unit 32, and transfers it to the processing tool 44 (as indicated by an arrow F3 in FIG. 3).

Subsequently, the processing tool 44 is lowered from above the chemical liquid tank 41, immerses the lot L in the chemical liquid, and performs a chemical liquid processing (S103 in FIG. 2). Thereafter, the processing tool 44 is raised to pick up the lot L from the chemical liquid, and then is moved in a horizontal direction (negative X-axis direction) toward a space above the rinse liquid tank 42 (as indicated by an arrow F4 in FIG. 3).

Next, the processing tool 44 is lowered from above the rinse liquid tank 42, immerses the lot L in the first rinse liquid, and performs a rinse liquid processing (S103 in FIG. 2). Thereafter, the processing tool 44 is raised to lift up the lot L from the first rinse liquid. Subsequently, the first transfer device 43 receives the lot L from the processing tool 44, and transfers it to the second transfer device 52.

Then, the second transfer arm 52c of the second transfer device 52 is moved in a horizontal direction (positive Y-axis direction), and is lowered from above the immersion tank 51 to immerse the lot L in the second rinse liquid (S104 in FIG. 2, as indicate by an arrow F5 in FIG. 3). The plurality of substrates W of the lot L are maintained in the second rinse liquid until they are picked up from the second rinse liquid by the third transfer device 53. Since the substrate W exists below the liquid surface of the second rinse liquid, the surface tension of the second rinse liquid does not act on the substrate W, so that a collapse of the irregularity pattern of the substrate W can be suppressed.

Next, the third transfer device 53 transfers the substrates W of the lot L held by the second transfer arm 52c in the second rinse liquid to the second delivery table 54 (as indicated by an arrow F6 in FIG. 3). The third transfer device 53 transfers the substrates W to the second delivery table 54 one by one.

Thereafter, the fourth transfer device 61 receives the substrates W from the second delivery table 54, and transfers them to the liquid processing apparatus 62 (arrow F7 in FIG. 3)

Then, the liquid processing apparatus 62 processes the substrates W one by one with a liquid (S105 in FIG. 2). The liquid may be plural in number. By way of example, pure water such as DIW and a drying liquid having a lower surface tension than the pure water may be used. The drying liquid may be, by way of non-limiting example, alcohol such as IPA. The liquid processing apparatus 62 supplies the pure water and the drying liquid to a top surface of the substrate W in this order to form a liquid film of the drying liquid.

Subsequently, the fourth transfer device 61 receives the substrates W from the liquid processing apparatus 62, and holds the substrate W horizontally with the liquid film of the drying liquid facing upwards. The fourth transfer device 61 transfers the substrates W from the liquid processing apparatus 62 to the drying apparatus 63 (as indicated by an arrow F8 in FIG. 3).

Thereafter, the drying apparatus 63 dries the substrates W one by one with a supercritical fluid (S105 in FIG. 2). The drying liquid can be replaced with the supercritical fluid, so that a collapse of the irregularity pattern of the substrate W due to the surface tension of the drying liquid can be suppressed. Since the supercritical fluid requires a pressure-resistant vessel, the drying processing is performed as a single-wafer processing instead of a batch processing in order to size down the pressure-resistant vessel.

In addition, although the drying apparatus 63 is of the single-wafer type in the present exemplary embodiment, it may be of a batch type as mentioned above. The batch-type drying apparatus 63 dries the plurality of substrates W having the liquid film at once with the supercritical fluid. While the single-wafer type drying apparatus 63 has one transfer arm for holding the substrate W, the batch type drying apparatus 63 has a plurality of transfer arms.

Further, although the drying apparatus 63 of the present exemplary embodiment dries the substrate W with the supercritical fluid, a drying method is not particularly limited. The drying method may be any of various methods as long as the collapse of the irregularity pattern of the substrate W can be suppressed. By way of example, spin drying, scan drying, or water repellent drying may be adopted. In the spin drying, the substrate W is rotated and the liquid film is scattered from the substrate W by a centrifugal force. In the scan drying, by rotating the substrate W while moving a supply position of the drying liquid from a center of the substrate W toward a periphery of the substrate W, the liquid film is scattered form the substrate by a centrifugal force. In the scan drying, a supply position of a drying gas such as a $N_2$ gas may be moved from the center of the substrate W toward the periphery thereof so as to follow the supply position of the drying liquid.

Subsequently, the fourth transfer device 61 receives the substrates W from the drying apparatus 63, and transfers them to the first delivery table 33 (as indicated by an arrow F9 in FIG. 3).

Next, the substrate moving/placing device 31 receives the substrate W from the first delivery table 33 and stores it in the cassette C disposed on the loader 23 (S106 in FIG. 2, as indicated by an arrow F10 in FIG. 3).

Next, the cassette transfer device 24 transfers the cassette C from the loader 23 to the load port 21 (as indicated by an arrow F11 in FIG. 3). The cassette C transferred to the load port 21 is carried out from the carry-in/out unit 2 while accommodating the multiple number of substrates W therein. Here, the cassette transfer device 24 may transfer the cassette C from the loader 23 to the stocker 22 and store it temporarily in the stocker 22.

When it is determined in the process S101 of FIG. 2 that the batch processing is to be performed, the control device 9 controls the individual components of the substrate processing system 1 to move the substrates W accommodated in the cassette C to the single-wafer processing unit 6 (S107 in FIG. 2). Specifically, the substrate moving/placing device 31 receives the substrates W accommodated in the cassette C, and transfers them to the first delivery table 33 (as indicate by an arrow G2 in FIG. 4). Subsequently, the fourth transfer device 61 receives the substrates W from the first delivery table 33, and transfers them to the liquid processing apparatus 62 (as indicated by an arrow G3 in FIG. 4).

Next, the same as in the process S105 in FIG. 2, the liquid processing apparatus 62 processes the substrates W one by one with the liquid, and, then, the drying apparatus 63 dries the substrates W one by one with the supercritical fluid (S108 in FIG. 2, as indicated by an arrow G4 in FIG. 4).

Thereafter, the fourth transfer device 61 receives the substrates W from the drying apparatus 63, and transfers them to the first delivery table 33 (as indicated by an arrow G5 in FIG. 4).

Afterwards, the substrate moving/placing device 31 receives the substrate W from the first delivery table 33 and stores them in the cassette C placed in the loader 23 (S109 in FIG. 2, as indicated by an arrow G6 in FIG. 4).

Then, the cassette transfer device 24 transfers the cassette C from the loader 23 to the load port 21 (as indicated by an arrow G7 in FIG. 4). The cassette C transferred to the load port 21 is carried out from the carry-in/out unit 2 while accommodating therein the multiple number of substrates W. Further, the cassette transfer device 24 may transfer the cassette C from the loader 23 to the stocker 22 and store it temporarily in the stocker 22.

In the substrate processing method according to the above-described exemplary embodiment, if, for example, a first cassette to be subjected to the complex processing is transferred to the loader 23, the first interface unit 3 distributes substrates W accommodated in the first cassette to the batch processing unit 4.

The substrates W distributed to the batch processing unit 4 are subjected to the batch processing in the batch processing unit 4. The second interface unit 5 transfers the batch-processed substrates W to the single-wafer processing unit 6. The substrates W transferred to the single-wafer processing unit 6 are subjected to the single-wafer processing in the single-wafer processing unit 6. In this way, the substrates W distributed to the batch processing unit 4 are returned to the cassette C in the loader 23 after being subjected to the complex processing including the batch processing and the single-wafer processing.

If a second cassette to be subjected to the single-wafer processing is transferred to the loader 23 while the complex processing is being performed on the substrate W taken out from the first cassette, the first interface unit 3 distributes substrates W accommodated in the second cassette to the single-wafer processing unit 6. The substrates W distributed to the single-wafer processing unit 6 are subjected to the single-wafer processing in the single-wafer processing unit 6.

In this way, according to the substrate processing method of the present exemplary embodiment, the complex processing including the batch processing and the single-wafer processing, and the single-wafer processing without passing through the batch processing unit 4 can be performed in parallel.

The first cassette as the target of the complex processing is a cassette which accommodates therein product substrates, for example. The second cassette as the target of the single-wafer processing is a cassette that accommodates therein dummy substrates, for example. In this case, the complex processing for the product substrates and a dummy processing in the single-wafer processing unit 6 using the dummy substrates can be performed in parallel. The dummy processing may be, for example, a processing of performing components replacement or the like on at least one drying apparatus 63 among the drying apparatuses 63 arranged in multiple levels and then putting a plurality of dummy substrates into that drying apparatus 63 to improve cleanliness thereof. Unlike the product substrates, the dummy substrates do not need to be subjected to the batch processing (for example, the chemical liquid processing). By transferring the dummy substrates to the single-wafer processing unit 6 without passing through the batch processing unit 4, unnecessary transportation can be omitted, and the time required for the dummy processing can be shortened. Further, the first cassette may accommodate first product substrates to be subjected to the complex processing, and the second cassette may accommodate second product substrates to be subjected to the single-wafer processing only.

In addition, the second cassette, which is the target of the single-wafer processing, may be a cassette that accommodates therein the product substrates. In this case, the complex processing on the product substrates and the single-wafer processing on the product substrates can be performed in parallel. Further, the first cassette to be subjected to the complex processing may be a cassette accommodating therein the dummy substrates. In this way, the types of the substrates accommodated by the first cassette and the second cassette are not limited. Also, for three or more cassettes C, the complex processing and the single-wafer processing can be performed in parallel in the same manner.

The exemplary embodiments disclosed herein are illustrative in all aspects and do not limit the present disclosure. The above-described exemplary embodiments may be omitted, replaced and modified in various ways without departing from the scope and the spirit of the appended claims.

According to the exemplary embodiment, it is possible to perform the complex processing including the batch processing and the single-wafer processing, and the single-wafer processing in parallel.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing system, comprising:
a carry-in/out unit in which a cassette accommodating therein multiple substrates is carried in and out;
a batch processing unit configured to process a lot including the multiple substrates at once;
a single-wafer processing unit configured to process the substrates one by one;
a first interface unit configured to distribute the substrates accommodated in the cassette to either the single-wafer processing unit or the batch processing unit; and
a second interface unit configured to transfer the substrates between the batch processing unit and the single-wafer processing unit,
wherein the first interface unit comprises:
a first placement unit configured to place therein the substrates before and after being processed by the single-wafer processing unit;
a second placement unit configured to place therein the substrates before being processed by the batch processing unit; and
a transfer device configured to transfer the substrates accommodated in the cassette to the first placement unit and the second placement unit.

2. The substrate processing system of claim 1,
wherein the first placement unit includes:
a first region in which the substrates before being processed by the single-wafer processing unit are placed; and
a second region in which the substrates after being processed by the single-wafer processing unit are placed, and
wherein the first region and the second region are arranged in a vertical direction.

3. The substrate processing system of claim 2,
wherein the first region is allowed to accommodate therein a first number of the substrates,
the second region is allowed to accommodate therein a second number of the substrates, and
the second number is larger than the first number.

4. The substrate processing system of claim 2,
wherein the second region is provided at an upper end thereof in the vertical direction than the first region.

5. The substrate processing system of claim 1,
wherein the lot includes the multiple substrates at a first pitch, and
the first placement unit arranges the substrates at a second pitch that is N times the first pitch (N is a natural number equal to or larger than 2).

6. The substrate processing system of claim 5,
wherein the cassette accommodates the substrates at the second pitch.

7. The substrate processing system of claim 1, further comprising:
a control device,
wherein the control device is configured to control the transfer device to transfer the multiple substrates accommodated in the cassette to either one of the first placement unit and the second placement unit based on information associated with the cassette carried in the carry-in/out unit.

8. A substrate processing method performed in a substrate processing system including a carry-in/out unit in which a cassette accommodating therein multiple substrates is carried in and out; a batch processing unit configured to process a lot including the multiple substrates at once; and a single-wafer processing unit configured to process the substrates one by one, the substrate processing method comprising:
(a) transferring the substrates accommodated in the cassette to the single-wafer processing unit without passing through the batch processing unit, and returning the substrates to the cassette after processing the substrates in the single-wafer processing unit;
(b) transferring the lot including the multiple substrates accommodated in the cassette to the batch processing unit, and processing the lot at once in the batch processing unit; and
(c) transferring the lot processed in the batch processing unit from the batch processing unit to the single-wafer processing unit, and returning the substrates to the cassette after processing the substrates in the single-wafer processing unit.

9. The substrate processing method of claim 8,
wherein the (b) and the (c), and the (a) are performed in parallel.

10. A computer-readable recording medium having stored thereon computer-executable instructions that, in response to execution, cause a substrate processing method as claimed in claim 8 to be performed.

* * * * *